US007233521B1

(12) United States Patent
Mirgorodski et al.

(10) Patent No.: US 7,233,521 B1
(45) Date of Patent: Jun. 19, 2007

(54) APPARATUS AND METHOD FOR STORING ANALOG INFORMATION IN EEPROM MEMORY

(75) Inventors: Yuri Mirgorodski, Sunnyvale, CA (US); Peter J. Hopper, San Jose, CA (US); Vladislav Vashshenco, Palo Alto, CA (US); Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 62 days.

(21) Appl. No.: 11/078,761

(22) Filed: Mar. 11, 2005

(51) Int. Cl.
*G11C 11/34* (2006.01)

(52) U.S. Cl. .............................. 365/185.01; 365/185.1; 365/185.05

(58) Field of Classification Search ........... 365/185.01, 365/185.03, 185.05, 185.1, 185.26, 185.18, 365/185.23
See application file for complete search history.

(56) References Cited

U.S. PATENT DOCUMENTS

| | | | | |
|---|---|---|---|---|
| 4,940,982 A | * | 7/1990 | Gulczynski | 341/169 |
| 5,043,940 A | * | 8/1991 | Harari | 365/185.03 |
| 5,428,621 A | * | 6/1995 | Mehrotra et al. | 714/721 |
| 6,137,723 A | | 10/2000 | Bergemont et al. | |
| 6,466,482 B2 | * | 10/2002 | Shukuri et al. | 365/185.24 |
| 6,788,572 B2 | | 9/2004 | Yamada et al. | |
| 6,985,386 B1 | * | 1/2006 | Mirgorodski et al. | 365/185.05 |
| 6,992,927 B1 | * | 1/2006 | Poplevine et al. | 365/185.05 |
| 7,020,027 B1 | * | 3/2006 | Poplevine et al. | 365/185.28 |
| 7,042,763 B1 | * | 5/2006 | Mirgorodski et al. | 365/185.05 |

FOREIGN PATENT DOCUMENTS

WO  WO9322770  * 11/1993

OTHER PUBLICATIONS

U.S. Appl. No. 11/057,355, filed Feb. 2005.
"Everything a System Engineer Needs to Know About Serial EEPROM Endurance", http://ww1.microchip.com/downloads/en/AppNotes/00537.pdf., © 1992 Microchip Technology Inc., 10 pages.
Lorenzini, M. et al., "A dual gate flash EEPROM cell with two-bits storage capacity", Nonvolatile Memory Technology Conference, 1996., Sixth Biennial IEEE International, Publication Date: Jun. 24-26, 1996, pp. 84-90 Albuquerque, NM, USA, ISBN: 0-7803-3510-4.

* cited by examiner

*Primary Examiner*—Richard T. Elms
*Assistant Examiner*—Douglas King
(74) *Attorney, Agent, or Firm*—Beyer Weaver LLP

(57) ABSTRACT

A storage device that is capable of receiving an analog signal and storing it as a digital signal. The storage device includes an input node configured to receive an analog input voltage and two non-volatile storage cells. A second non-volatile memory cell is coupled to receive the analog input signal from the input node. The second non-volatile memory cell is capable of being programmed to a one of a plurality of programming states. The first non-volatile memory cell, which is coupled to the second non-volatile memory cell, is also capable of being programmed to one of a plurality of programming states. During operation, the second non-volatile memory cell and the first non-volatile memory cell are both programmed to a selected second programming state indicative of the magnitude of the analog input voltage. The first programming state and the second programming state are together are indicative of a digital value commensurate with the magnitude of the analog input voltage.

18 Claims, 5 Drawing Sheets

APPARATUS AND METHOD FOR STORING ANALOG INFORMATION IN EEPROM MEMORY

CROSS REFERENCE TO RELATED APPLICATIONS

The present application is related to U.S. patent application Ser. No. 10/895,710, filed Jul. 8, 2004; Ser. No. 10/895,711, filed Jul. 8, 2004; Ser. No. 10/895,713, filed Jul. 8, 2004; Ser. No. 10/895,712, filed Jul. 8, 2004; and "Non-Volatile Memory Structure and Erase Method With Floating Gate Voltage Control", filed Feb. 14, 2005, Ser. No. 11/057,355, all of which are incorporated by reference herein for all purposes.

FIELD OF THE INVENTION

The present invention relates generally to non-volatile semiconductor memories, and more particularly, to an electronically erasable programmable read only memory (EEPROM) cell capable of receiving an analog voltage signal and storing it as a digital signal.

BACKGROUND OF THE INVENTION

Non-volatile semiconductor memories are capable of storing data after power to the device has been turned off. In other words, the contents of the memory is maintain and is not destroyed when power is removed from the device. In contrast with volatile memory devices, such as static random access memories (SRAM) or dynamic random access memories (DRAM), the contents of the memory are destroyed after power is removed.

An electronically erasable programmable read only memory or EEPROM is one type of well known non-volatile memory. A typically EEPROM memory cell is a single transistor device having a source and drain formed in the substrate, a floating gate formed over the source and drain regions, and a control gate that is formed over the floating gate. The floating gate is considered "floating" because it is completely surrounded by an insulator, such as oxide, and is not electrically connected to any other circuitry in the device.

EEPROM cells typically have three states, programming, erase and read. In the program state, a charge is placed onto the floating gate sufficient to turn the transistor on (i.e., a channel is created between the source and drain regions in the substrate). For example with a P channel device, a negative charge of sufficient magnitude is provided on the floating gate to exceed the threshold voltage of the transistor. A high voltage is applied across the source and drain of the transistor. This causes electrons to travel from the source to the drain. Simultaneously, a high positive voltage is applied to the control gate. The high potential causes some of the electrons moving between the source and drain to "jump" through the insulation layer and become trapped on the floating gate. This process, sometimes referred to as "hot-electron injection", causes the charge on the floating gate to become more negative. Eventually, the charge falls below the threshold voltage of the transistor, and the transistor remains in a permanent on state until the device is erased.

In the erase state, a positive charge is placed on the floating gate so that the voltage is less than the threshold voltage. As a result, the device is permanently off, and there is no electrical conduction between the source and drain. Erasure of the device can be accomplished in a number of different ways. For example, a high positive voltage can be applied to the bulk silicon. This will cause electrons to tunnel from the floating gate to the silicon. Alternatively, a high negative voltage can be applied to the control gate. This too will cause electrons to tunnel from the floating gate to the bulk silicon. In either case, the net charge on the floating gate becomes more positive and will eventually exceed the threshold voltage. When this occurs, the device turns off.

During a read operation, a voltage is applied between the source and drain. If the voltage of the floating gate is below the threshold, the device is programmed and current will flow between the source and drain. If the voltage of the floating gate is above the threshold, the device remains off, and no current flows between the source and drain. A sense amp is provided to measure or sense the current between the source and drain. If current is detected, then the sense amp determines that the cell is programmed. Otherwise, the sense amp determines that the cell is in the erased state. The program and erase states of the cell can be interpreted as a logical one or zero, or vice versa, depending on the design of the system.

It should be noted that the aforementioned discussion pertains to P-channel devices. With N-channel devices, the operation is essentially the complement of that described above. Lastly, the specific voltages applied to the device to induce either the program or erase state depends on the capacitive coupling between the components of the cell as is well known in the art.

The problem with the standard EEPROM memory cell is that it is capable of maintaining only two states, program and erase. It can not therefore receive an analog signal and store it as a digital signal.

An EEPROM cell that is capable of receiving an analog signal and storing it as a digital signal is therefore needed.

SUMMARY OF THE INVENTION

To achieve the foregoing, and in accordance with the purpose of the present invention, an EEPROM storage device that is capable of receiving an analog signal and storing it as a digital signal is disclosed. The EEPROM storage device includes an input node configured to receive an analog input voltage and two non-volatile storage cells. A second non-volatile memory cell is coupled to receive the analog input signal from the input node. The second non-volatile memory cell is capable of being programmed to a one of a plurality of programming states. The first non-volatile memory cell, which is coupled to the second non-volatile memory cell, is also capable of being programmed to one of a plurality of programming states. During operation, the second non-volatile memory cell and the first non-volatile memory cell are both programmed to a selected second programming state indicative of the magnitude of the analog input voltage. The first programming state and the second programming state are together are indicative of a digital value commensurate with the magnitude of the analog input voltage.

BRIEF DESCRIPTION OF THE DRAWINGS

The invention, together with further advantages thereof, may best be understood by reference to the following description taken in conjunction with the accompanying drawings in which.

In the Figures, like reference numbers refer to like components and elements.

DETAILED DESCRIPTION OF THE INVENTION

In the aforementioned related application U.S. patent application Ser. No. 10/895,710, a four transistor EEPROM memory cell is disclosed. With this cell, one of the four transistors are used for programming, erasing, control, and read operation respectively. Although the size of this type of cell is larger than a standard one transistor cell, each of the four transistors can be optimized to perform its specific function. As a result, improved performance is achieved. In aforementioned related application U.S. patent application Ser. No. 10/895,711, an improved way of programming the four transistor EEPROM cell is disclosed. Specifically, a programming mode relying on a positive floating gate voltage and a low programming current is taught. In related U.S. patent application Ser. No. 10/895,713, a technique of using a ramp-down of the control voltage applied to the control gate is disclosed for the purpose of allowing less sensitivity to process variations and erasing. In related application U.S. patent application Ser. No. 10/895,712, the concept of using a ramp-up voltage for the control gate during programming is disclosed. Finally, in U.S. patent application entitled "Non-Volatile Memory Structure and Erase Method With Floating Gate Voltage Control", filed Feb. 14, 2005, Ser. No. 11/057,355 is disclosed. As previously noted, the aforementioned pending U.S patent applications are each incorporated by reference herein for all purposes.

Figure 1:
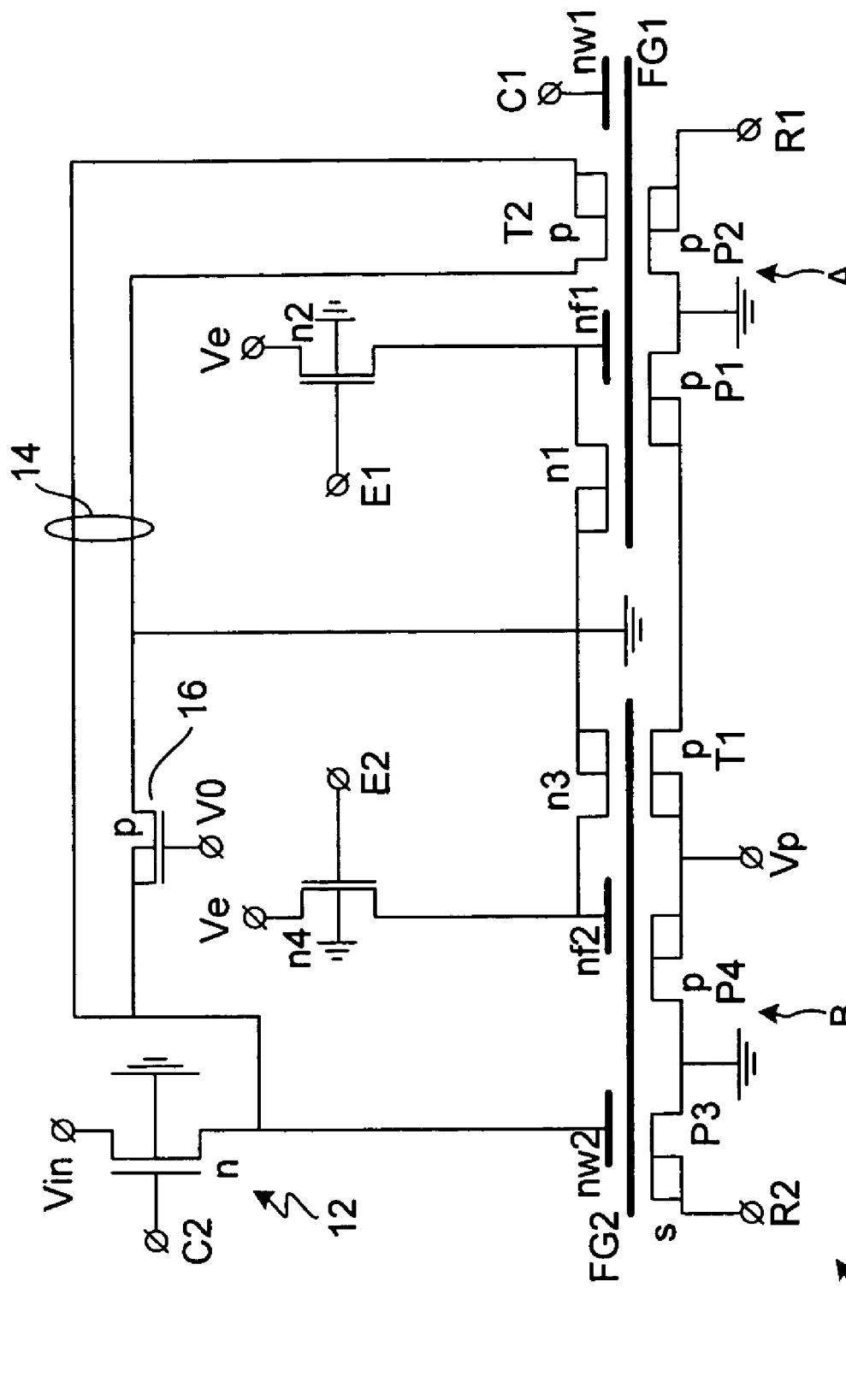
FIG. 1 is as circuit diagram of the storage device of the present invention.

Referring to FIG. 1, a circuit diagram of the storage device 10 of the present invention is disclosed. The storage device 10 includes two memory cells labeled A and B respectively. The storage device receives an analog signal Vin and stores values commensurate with the received value in the two cells A and B in digital form. For example, if an analog signal of a magnitude representative of the number 35 is received, then the cell B will store a value indicative of a "3" and the cell A will store a value indicative of a "5".

The storage cell A includes P-channel floating gate transistors designated P1, P2 and N-channel transistors n1 and n2, a Floating gate FG1 and two control gates nf1 and nw1. Transistors P1, P2, and n1 share the common floating gate FG1. The floating gate FG1 is controlled by the two floating control gates nf1 and nw1. Transistor P1 has its drain connected to ground and its source connected to the drain of transistor T1. Transistor P2 has its source connected to a read control voltage R1 and its drain connected to ground in common with the drain of P1. The source of n1 and the source of n3 are both connected to ground. The drain of n1 is connected to nf1. The gate of transistor n2 is connected to an erase control signal E1, the drain is connected to an erase voltage Ve, and the source is connected to control gate nf1. Control gate nw1 is connected to a control signal voltage C1.

The storage cell B includes P-channel floating gate transistors designated P3, P4 and N-channel transistors n3 and n4, a floating gate FG2 and two control gates nf2 and nw2. Transistors P3, P4, and n3 share the common floating gate FG2. The floating gate FG2 is controlled by the two floating control gates nf2 and nw2. Transistor P3 has its drain connected to ground and its source connected to read control voltage R2. Transistor P4 has its source connected to the source of T1 and its drain connected to ground in common with the drain of P3. The source of n3 and the source of n1 are both connected to ground. The drain of n3 is connected to nf2. The gate of transistor n4 is connected to an erase control signal E2, the drain is connected to an erase voltage Ve, and the source is connected to nf2.

The storage device 10 also includes an input circuit including an N-channel transistor 12. The drain of transistor 12 is connected to the input voltage Vin, the source is connected to control gate nw2 of cell B, and the gate is connected to receive a control voltage C2.

The storage device further includes a feedback loop 14 that includes a "limiting" P-channel transistor 16 and another P-channel transistor T2. The transistor 16 has its gate coupled to a limiting voltage V0, its source coupled to the source of transistor 12 and control gate nw2, and its drain coupled to ground. The transistor T2 has its source coupled to the source of transistor 12 and control gate nw2, and its drain coupled to ground.

The storage device 10 includes three modules including, the erase module, the programming module, and the program control module. Each of these modules is described in greater detail below.

The Erase Module

Figure 2A:
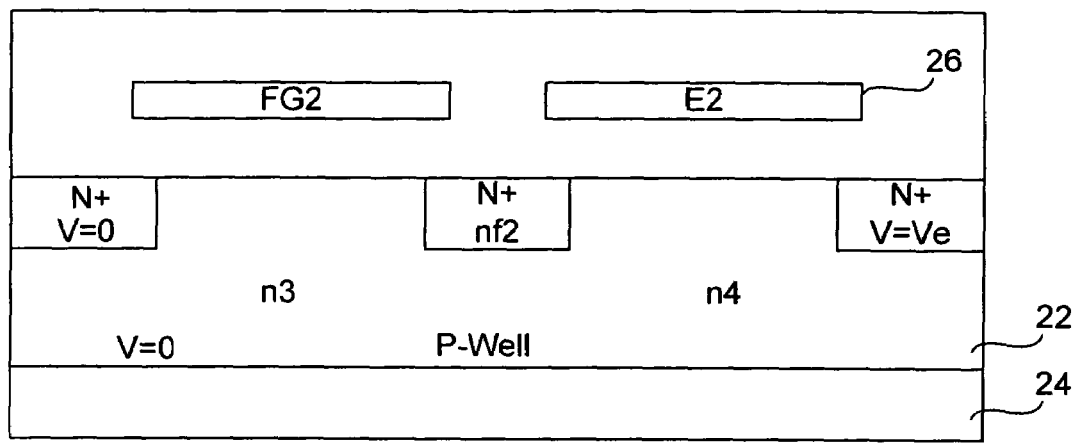
FIGS. 2A and 2B are a cross section and circuit of an erase module of the storage device of the present invention.
Figure 2B:
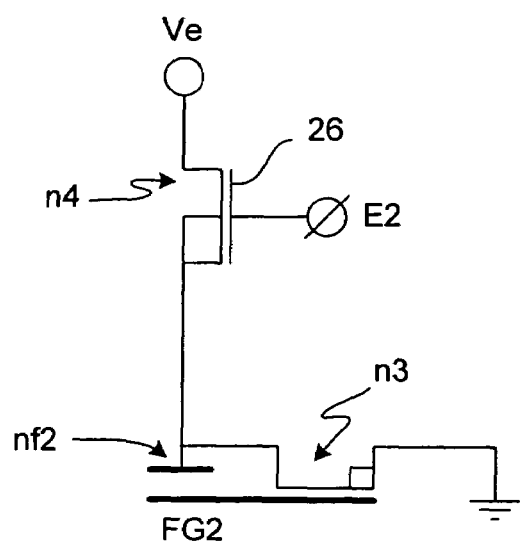

Referring to FIGS. 2A and 2B, a cross section of the erase module transistors and a circuit diagram of the erase module transistors are shown respectively. The cross section 20 illustrates transistors n3 and n4 formed in a P-well 22 of a substrate 24. Specifically, the N+ regions forming the source and drain of each transistor n3 and n4 are formed in P-well 22. The gate 26 of transistor n4 is coupled to control signal E2.

During an erase operation, control signal E2 is pulsed and an erase voltage Ve (e.g., 15 volts) is applied to the drain of transistor n4. During the pulse of E2, transistor n4 is turned on by control signal E2, causing the floating N+ region nf2 to charge to the erase voltage Ve. As the floating region nf2 charges, electrons on the floating gate FG2 begin to tunnel from the gate to the floating region nf2. Consequently the net charge on the floating gate FG2 becomes more positive. When the pulse E2 terminates, transistor n4 turns off. The floating region nf2, however, is still positively charged, and as a result, tunneling continues. Eventually the charge on the floating gate FG2 will reach the threshold voltage of transistor n3. When this occurs, transistor n3 turns on, and the charge on the floating region nf2 is grounded through the source of the transistor which is connected to ground. As a result, the voltage of nf2 drops, tunneling stops, and the potential of the floating gate FG2 is set to the threshold voltage of transistor n4. The floating gate FG2 is thus erased. Although not illustrated or described, the erasure of the other floating gate FG1 of cell A is essentially the same as described above.

The Program Module

Figure 3A:
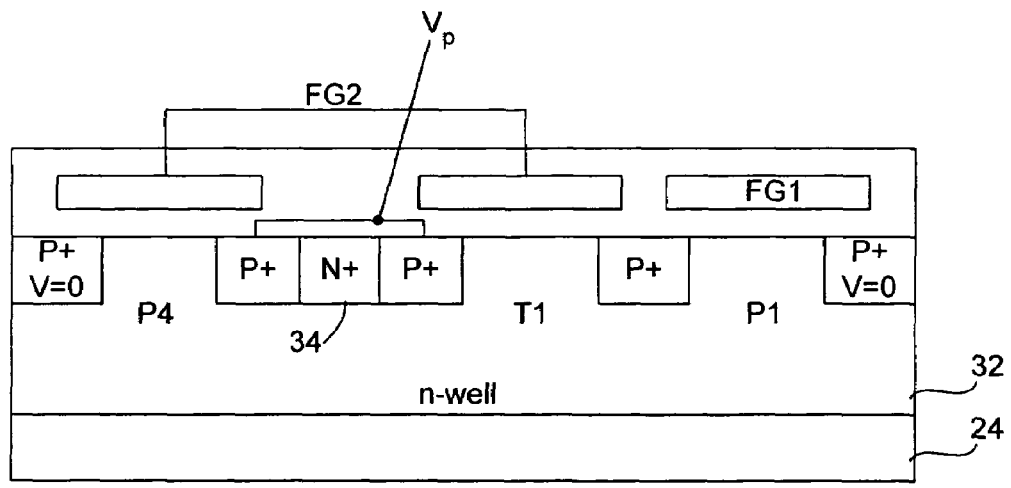
FIGS. 3A and 3B are a cross section and circuit of a program module of the storage device of the present invention.
Figure 3B:
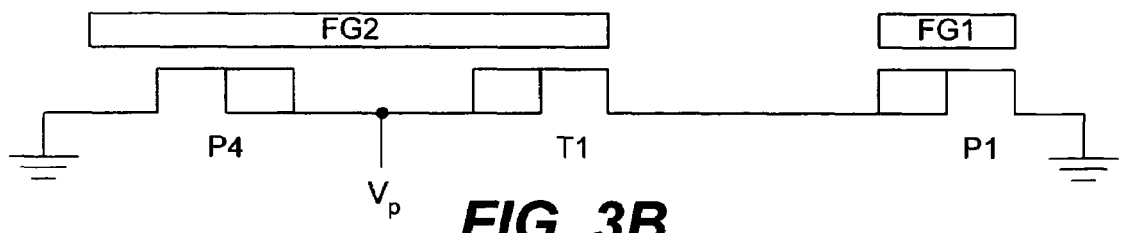

Referring to FIGS. 3A and 3B, a cross section of the program module transistors and a circuit diagram of the program module transistors are shown respectively. The cross section 30 illustrates transistors P1, T1 and P4 formed in a N-well 32 on substrate 24. The source and drains of transistors P1, P4 and T1 are all formed in P+ wells in the N-well 32. A N+ region 34 is provided between T1 and P4. The drain of P1 is coupled to ground (V=0) and the source is in common with the drain of T1. The drain of T1 is in common with the source of P1 and the drain is coupled to a P+ floating region adjacent the N+ region 34. Transistor P4 has its drain coupled to ground (V=0) and its source coupled to a P+ floating region, adjacent the N+ region 34. The N+ region 34 and the adjacent P+ regions are electrically connected forming one common programming electrode to which a programming voltage (e.g., 5 volts is applied.

Prior to programming, the transistors P1, P4 and T1 are all off and erased prior to programming. A programming voltage Vp is then applied to the source of transistor P4 and the drain of T1. To initiate the programming sequence, a programming voltage is applied to the control gate nw2 of FG2. This is accomplished by using control signal C2 to turn on transistor 12, applying the input voltage Vin to the control gate nw2. As the voltage on the control gate nw2 increases, the voltage on the floating gate FG2 also increases, causing electrons from the drain of P4 to flow to the floating gate FG2. The storage cell B is thus programmed as the floating gate FG2 is charged.

The storage cell A can be programmed only after storage cell B is programmed. As the electrons accumulate and the charge on FG2 becomes more negative, transistor T1 eventually turns on when its threshold voltage is exceeded. When transistor T1 turns on, the programming voltage Vp is applied to the source of transistor P1. When this occurs, the first floating gate FG1 can be programmed when a voltage C1 is applied to the floating gate nw1.

With the above arrangement, floating gate FG2 is programmed first before floating gate FG1 can be programmed. Transistor T1 needs to be turned on before the floating gate FG1 can be programmed.

Program Control Module

Figure 4A:
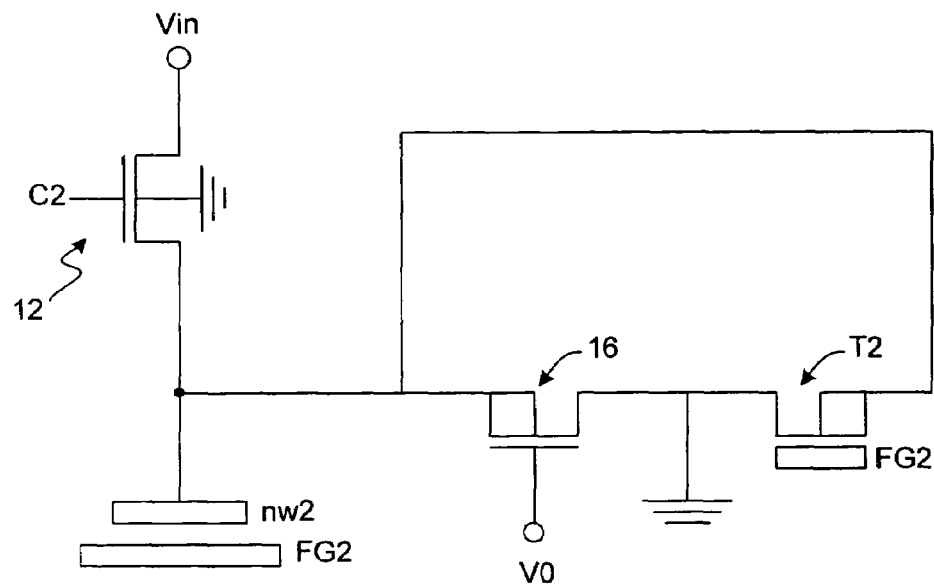
FIGS. 4A and 4B are a circuit diagram and a cross section of a program control module of the storage device of the present invention.
Figure 4B:
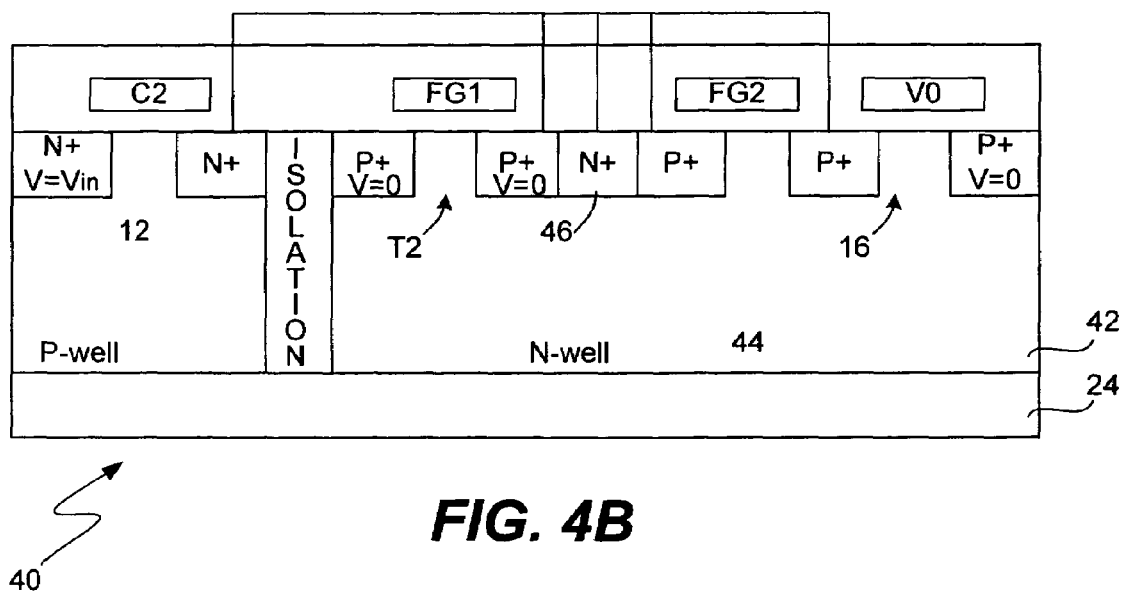

The transistors of the program control module are illustrated in FIG. 4A. These transistors include the input transistor 12, the "limiting" transistor 16 and transistor T2. A cross section 40 of the transistors are illustrated in FIG. 4B. The transistor 12 is formed in a P-well 42 on substrate 24. The drain of transistor 12 is coupled to Vin. Transistors T2 and 16 are formed in an N-well 44 on substrate 24. The source and drains of both transistors T2 and 16 are formed by P+ wells in the N-well 44. The gate of T2 is the floating gate FG1. The gate of transistor 16 is coupled to V0.

The program control module is responsible for controlling the programming sequence of cells A and B. Program control is initiated by turning transistor 12 on by pulsing the control signal C2. When transistor 12 is on, the voltage Vin is applied to the control gate nw2, and the source of transistor 16. If the potential of Vin exceeds that of V0, gate 16 turns on. The voltage applied to the control gate nw2 is therefore limited.

The voltage Vin is also applied to the source of transistor T2. Initially, the floating gate FG1 is positively charged (erased) and the transistor T2 is off. Consequently, no current flows through transistor T2 and the potential of Vin is not reduced. However, during subsequent programming cycle, as described in more detail below, the floating gate FG1 assumes incremental programming states. With each cycle, transistor T2 is turned on harder and harder at stepped programming levels. Consequently, the resistance of transistor T2 decreases at each stepped level, resulting in a stepped decrease in the potential of Vin applied to the control gate nw2.

A Measurement Sequence

Figure 5:
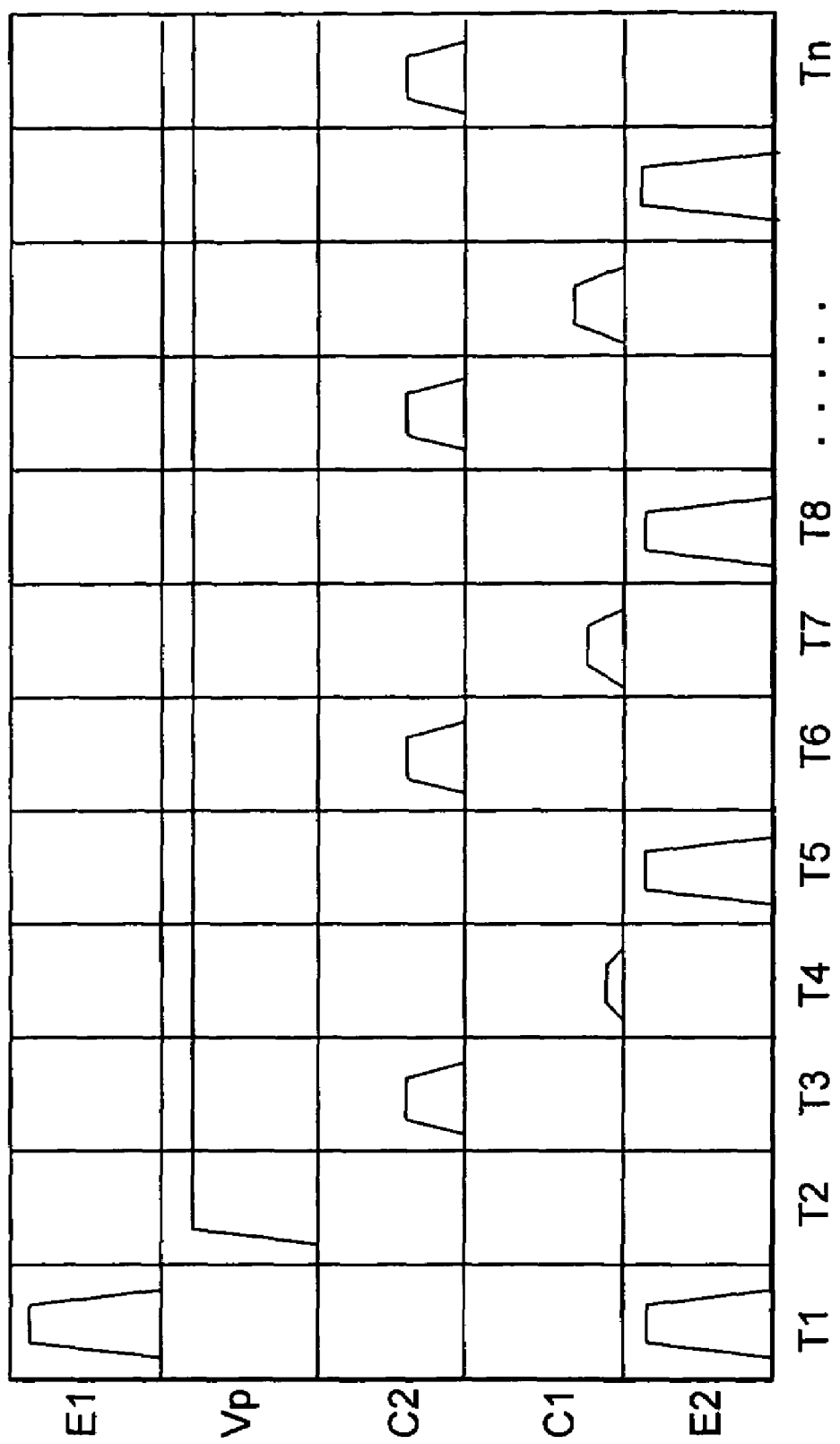
FIG. 5 is a timing diagram illustrating a measurement cycle of the storage device of the present invention.

Operation of the storage device 10 is best described using an actual measurement cycle. Referring to FIG. 5, a signal sequence timing diagram of a measurement cycle is illustrated. The measurement cycle includes the sequence for signals E1, Vp, C2, C1 and E2 during time intervals $T_1$ through $T_n$. As described in more detail below, the measurement sequence may include several programming cycles, depending on the magnitude or value of the measured signal. For the sake of illustration, the measurement sample below contains several programming cycles.

In time interval T1, the erase control signals are pulsed to erase the cells A and B respectively. The control signals E1 and E2 turn on transistors n2 and n4, charging the control gates nf1 and nf2 to the erase voltage Ve (approximately +15 volts) respectively. The high positive voltage on the control gates nf1 and nf2 attracts electrons from the floating gates FG1 and FG2. As a result, the charge on the floating gates FG1 and FG2 becomes more positive, effectively erasing the cells A and B.

In time interval T2, the programming voltage Vp is applied to the two sources of transistors P2 and T1 for the duration of the measurement cycle.

In time interval T3, control signal C2 is pulsed, turning on transistor 12. As a result, a voltage is applied to the control gate nw2. The value of the voltage applied to nw2 depends on the signal to be measured (Vin), the limiting voltage V0 applied to transistor 16, and the resistance of transistor T2. In other words, nw2 can not be charged to a potential higher than V0. The voltage applied to nw2, however, can be less than the V0 level when the resistance of T2 is very low. As the control gate nw2 charges, electrons from the drain of transistor P2 are "hot injected" onto the floating gate FG2. As the charge on the floating gate FG2 becomes more negative, the cell B becomes programmed. Eventually the negative charge on the floating gate FG2 becomes sufficient to turn on transistor T1. When transistor T1 is on, the programming voltage Vp is applied to the source of transistor P1. The floating gate FG1 of cell A is now ready to be programmed.

In time interval T4, control signal C1 is pulsed to charge the control gate nw1. The potential value of C1 depends on the number of levels (i.e., digits) storage cell A is configured to store. For example, if storage cell A is capable of storing ten digits (0 through 9), then C1 will have ten incremental levels. During each programming cycle, the value of C1 is incremented. When C1 is pulsed, transistor T2 is turned on. With each successive level of C1, transistor T2 turns on an incremental level harder. As a result, the resistance of transistor T2 is decreased at stepped intervals at each level of C1. Consequently, after a few successive programming cycles the control gate nw2 voltage is reduced below V0. The number of cycles depends on Vin, V0, and the resistance of transistors 12 and 16. The voltage Vin applied to the control gate nw2 is reduced during each cycles as the value of C1 is increased to incremental levels at each successive programming cycle.

In time interval T5, the floating gate FG2 of cell B is erased by pulsing the control signal E2. This completes the first programming cycle.

In time interval T6, the next programming cycle begins by pulsing control signal C2, causing transistor 12 to turn on and Vin to again be applied to the control gate nw2. The Since transistor T2 is turned on harder than in the previous cycle, more current flows through to T2 to ground. As a result, the voltage at nw2 is lower and the floating gate FG2 is programmed to a lesser degree.

In the remaining cycles, the above programming sequence described in time intervals T3 through T6 is repeated so long as the voltage at the control gate nw2 is greater than V0. With each successive programming cycle, the voltage at the control gate nw2 is reduced. Eventually the voltage at nw2 becomes less than V0. When this occurs, the floating gate FG2 is programmed to a level insufficient to keep transistor T1 on. As a result, the programming voltage Vp is no longer applied to the source of transistor P1 and the floating gate FG1 can no longer be programmed, completing the measurement cycle.

For example, value of Vin was indicative of the number "35" and limiting voltage V0 was set to 10, then the aforementioned programming cycle would be repeated three times. In the fourth cycle, the voltage at control gate nw2 would be less than V0. Consequently, the floating gate FG1 would not be programmed to a fourth level but would remain at the previously programmed third level, indicative of the "3" in the value of 35. Similarly, in the fourth cycle, the voltage at the floating gate nw2 would charge the floating gate FG2 to a level indicative of a fifth level or "5". When the contents of the storage device 10 was read, by measuring the charge on floating gate FG1 of cell A and FG2 of cell B, the measured values would be indicative of the measured value of "3" and "5" or 35 respectively.

Cell A therefore is configured to store the most significant number of the value to be stored in the memory device 10. Cell B is configured to store the least significant number of the value to be stored.

A Read Operation

Once the storage device 10 has been programmed, it may be read to determine its contents. During a read operation, read control voltages R1 and R2 are applied to the sources of transistors P4 and P3 respectively to read the contents of each cell A and B by a read circuit (not shown) coupled to nodes R1 and R2 using techniques well known in the art. Since the floating gates can be programmed to multiple levels, there is a specified current range for each level. Thus the measured current level for each cell A and B is determinative of the two digits stored in the storage device 10.

Although the foregoing invention has been described in some detail for purposes of clarity of understanding, it will be apparent that certain changes and modifications may be practiced within the scope of the appended claims. For example, the aforementioned storage device was described as having two cells. This number is arbitrary and a storage device with any number of cells may be used. Also, the number of increments as determined by V0 is arbitrary and is not necessarily limited to 10 as described above. The number of increments may be either greater or smaller. Therefore, the described embodiments should be taken as illustrative and not restrictive, and the invention should not be limited to the details given herein but should be defined by the following claims and their full scope of equivalents.

We claim:

1. A storage device, comprising:
an input circuit configured to receive an analog voltage signal having a magnitude representative of a number to be stored in the storage device;
a first non-volatile storage cell configured to store a first charge indicative of a most significant position of the number, the first storage cell capable of being charged to a value limited by a limiting voltage;
a second non-volatile storage cell, coupled to the first storage cell, and configured to store a second charge indicative of a less significant position relative to the most significant position of the number value indicative of the analog signal received at the input circuit; and
a transistor coupled between the second and the first non-volatile memory cells, the transistor being configured to turn on when the second non-volatile memory cell has reached a programming state that exceeds a predetermined threshold and enabling the first non-volatile memory cell to be programmed.

2. The storage device of claim 1, wherein the first non-volatile storage cell comprises a first floating gate, a first erase control gate configured to erase the first floating gate, a second control gate configured to program the first floating gate to a control voltage C1.

3. The storage device of claim 1, wherein a control voltage C1 is incremented to control the programming state of the first floating gate at controlled increments, each controlled increment enabling the first floating gate to be charged to a different state, each different state being indicative of a different value of the most significant position of the number.

4. The storage device of claim 1, wherein the first non-volatile storage cell further comprises a programming transistor having a floating gate as its gate.

5. The storage device of claim 1, wherein the first non-volatile storage cell further comprises a read transistor having a floating gate as its gate, the read transistor enabling the charge on the first floating gate to be read when a read voltage is applied to the read transistor.

6. The storage device of claim 1, wherein the second non-volatile storage cell further comprises a second floating gate, a second erase control gate configured to erase the second floating gate, and a second control gate configured to control the charge on the floating gate.

7. The storage device of claim 6, wherein the second control gate is configured to receive the analog voltage signal having the magnitude representative of the number to be stored in the storage device.

8. The storage device of claim 6, wherein the second non-volatile storage cell further comprises a transistor having a drain electrode for providing electrons to flow to the second floating gate when the second floating gate is being programmed.

9. The storage device of claim 6, further comprising an erase transistor having a first electrode coupled to an erase voltage, a second electrode coupled to the second control gate configured to control the charge on the floating gate, and a gate configured to receive an erase control signal configured to turn on the erase transistor.

10. The apparatus of claim 1, wherein the input circuit is a transistor having a first electrode coupled to the analog voltage signal, a second electrode coupled to the second non-volatile storage cell, and a gate coupled to receive a control signal configured to turn the transistor on so that the analog voltage signal can be applied to the second non-volatile memory cell.

11. The apparatus of claim 10, further comprising a limiting transistor, coupled to the transistor and the second non-volatile memory cell, the limiting transistor configured to limit the analog voltage signal applied to the second non-volatile memory cell.

12. A method, comprising:

receiving an analog input voltage;

programming a second non-volatile memory cell capable of being programmed to a one of a plurality of programming states, the second non-volatile memory cell being programmed to a selected second programming state indicative of the magnitude of the analog input voltage;

programming a first non-volatile memory cell capable of being programmed to one of a plurality of programming states, the first non-volatile memory cell being programmed to a selected first programming state indicative of the magnitude of the analog input voltage;

wherein the programming the first non-volatile memory cell and the second non-volatile memory cell further comprises:

programming the second memory cell to its maximum programming level among the second plurality of programming states;

programming the first memory cell after the second programming cell has been programmed to a threshold state;

erasing the first memory cell;

reducing the analog input voltage applied to the second non-volatile memory cell by a known incremental amount; and repeating the above steps until the second non-volatile memory cell can not be programmed to a level that exceeds the threshold state, wherein the first programming state and the second programming state together are indicative of a digital value commensurate with the magnitude of the analog input voltage.

13. An apparatus, comprising:

an input node configured to receive an analog input voltage;

a second non-volatile memory cell coupled to receive the analog input signal from the input node, the second non-volatile memory cell capable of being programmed to a one of a plurality of programming states, the second non-volatile memory cell being programmed to a selected second programming state indicative of the magnitude of the analog input voltage;

a first non-volatile memory cell, coupled to the second non-volatile memory cell, and capable of being programmed to one of a plurality of programming states, the first non-volatile memory cell being programmed to a selected first programming state indicative of the magnitude of the analog input voltage and a transistor coupled between the second and the first non-volatile memory cells, the transistor being configured to turn on when the second non-volatile memory cell has reached a programming state that exceeds a predetermined threshold and enabling the first non-volatile memory cell to be programmed, wherein the first programming state and the second programming state are together are indicative of a digital value commensurate with the magnitude of the analog input voltage.

14. The apparatus of claim 13, further comprising an input transistor coupled between the input node and the second non-volatile memory cell.

15. The apparatus of claim 13, further comprising a feedback loop configured to selectively reduce the magnitude of the analog input voltage applied to the second non-volatile memory cell.

16. The apparatus of claim 13, further comprising a second erase transistor and a first erase transistor each configured to selectively apply an erase voltage to the second and first non-volatile memory cells respectively.

17. The apparatus of claim 13, further comprising a limiting transistor, coupled to the second non-volatile memory cell, and configured to limit the analog input voltage to prevent it from exceeding a predetermined threshold voltage.

18. The apparatus of claim 13, further comprising read transistors to read the contents of the second and the first non-volatile memory cells.

* * * * *

UNITED STATES PATENT AND TRADEMARK OFFICE
CERTIFICATE OF CORRECTION

PATENT NO. : 7,233,521 B1  Page 1 of 1
APPLICATION NO. : 11/078761
DATED : June 19, 2007
INVENTOR(S) : Mirgorodski et al.

It is certified that error appears in the above-identified patent and that said Letters Patent is hereby corrected as shown below:

Title Pg, Item (75), Inventors: please change "Vladislav Vashshenco" to --Vladislav Vashchenko--.

Signed and Sealed this

Twenty-first Day of October, 2008

JON W. DUDAS
*Director of the United States Patent and Trademark Office*